(12) United States Patent
Mun et al.

(10) Patent No.: US 11,751,416 B2
(45) Date of Patent: Sep. 5, 2023

(54) DISPLAY DEVICE, METHOD OF MANUFACTURING DISPLAY DEVICE, AND GUIDE STRUCTURE USED THEREIN

(71) Applicant: Samsung Display Co., LTD., Yongin-si (KR)

(72) Inventors: Eunjoong Mun, Seongnam-si (KR); Hyung-Don Na, Seoul (KR); Dong Yeon Lee, Anyang-si (KR); Jungkyu Jo, Hwaseong-si (KR); Hyeon Deuk Hwang, Cheonan-si (KR)

(73) Assignee: Samsung Display Co., LTD., Yongin-si (KR)

( * ) Notice: Subject to any disclaimer, the term of this patent is extended or adjusted under 35 U.S.C. 154(b) by 524 days.

(21) Appl. No.: 16/796,952

(22) Filed: Feb. 21, 2020

(65) Prior Publication Data
US 2020/0381648 A1    Dec. 3, 2020

(30) Foreign Application Priority Data

May 29, 2019  (KR) ......................... 10-2019-0063023

(51) Int. Cl.
*H10K 50/84*    (2023.01)
*G06F 1/16*    (2006.01)
(Continued)

(52) U.S. Cl.
CPC ......... *H10K 50/841* (2023.02); *G06F 1/1637* (2013.01); *G06F 1/1647* (2013.01);
(Continued)

(58) Field of Classification Search
CPC . H01L 51/524; H01L 51/003; H01L 51/0097; H01L 51/5281; H01L 51/5284; H01L 51/529; H01L 51/56; H01L 51/5253; H01L 27/3244; H01L 27/3223; H01L 27/32; H01L 2227/326; H01L 2251/301; H01L 2251/5338; G06F 1/1637; G06F 1/1647; G06F 1/1658; G06F 1/1656;
(Continued)

(56) References Cited

U.S. PATENT DOCUMENTS

| 8,497,956 B2 * | 7/2013 | Jung | ..................... G02B 5/3033 349/12 |
| 9,087,998 B2 * | 7/2015 | Jang | ..................... H01L 51/0097 |

(Continued)

FOREIGN PATENT DOCUMENTS

| KR | 10-1765299 | 7/2017 |
| KR | 10-2017-0105892 | 9/2017 |

(Continued)

*Primary Examiner* — Dale E Page
*Assistant Examiner* — Quovaunda Jefferson
(74) *Attorney, Agent, or Firm* — H.C. Park & Associates, PLC

(57) ABSTRACT

A display device including a display panel having a first surface and a second surface opposite to the first surface, a guide structure disposed on the first surface of the display panel, and a window disposed on the second surface of the display panel, in which the guide structure includes a guide film configured to apply a preliminary pressure to the display panel, and a cover panel disposed between the guide film and the display panel, the cover panel including a cushion layer.

12 Claims, 8 Drawing Sheets

(51) Int. Cl.
| | |
|---|---|
| *H10K 50/86* | (2023.01) |
| *H10K 50/87* | (2023.01) |
| *H10K 59/12* | (2023.01) |
| *H10K 71/00* | (2023.01) |
| *H10K 71/80* | (2023.01) |
| *H10K 77/10* | (2023.01) |
| *H05K 7/20* | (2006.01) |
| *H10K 102/00* | (2023.01) |

(52) U.S. Cl.
CPC .......... *G06F 1/1652* (2013.01); *G06F 1/1656* (2013.01); *H10K 50/86* (2023.02); *H10K 50/865* (2023.02); *H10K 50/87* (2023.02); *H10K 59/12* (2023.02); *H10K 71/00* (2023.02); *H10K 71/80* (2023.02); *H10K 77/111* (2023.02); *H05K 7/20963* (2013.01); *H10K 59/1201* (2023.02); *H10K 2102/00* (2023.02); *H10K 2102/311* (2023.02)

(58) Field of Classification Search
CPC ... G06F 1/1652; H05K 7/20963; Y02P 70/50; Y02E 10/549; G09F 9/33; H10K 50/841; H10K 50/86; H10K 50/865; H10K 50/87; H10K 59/12; H10K 71/00; H10K 71/08; H10K 77/111; H10K 59/1201; H10K 2102/00; H10K 2102/311; H10K 50/844; H10K 59/88; H10K 59/00
See application file for complete search history.

(56) References Cited

U.S. PATENT DOCUMENTS

| | | | | |
|---|---|---|---|---|
| 9,482,885 | B2* | 11/2016 | Joo | ............ G02F 1/0126 |
| 10,114,422 | B2 | 10/2018 | Lee et al. | |
| 10,182,134 | B2* | 1/2019 | Lim | ............ G06F 1/1684 |
| 10,236,471 | B2* | 3/2019 | Oh | ............ H10K 50/844 |
| 2017/0263891 | A1* | 9/2017 | Oh | ............ H01L 51/0097 |
| 2017/0315400 | A1* | 11/2017 | Ahn | ............ G02B 6/0085 |
| 2019/0073001 | A1 | 3/2019 | Kim et al. | |

FOREIGN PATENT DOCUMENTS

| | | | | |
|---|---|---|---|---|
| KR | 10-1911049 | | 10/2018 | |
| WO | WO-2017204483 A1 | * | 11/2017 | ............ G06F 1/16 |

* cited by examiner

DISPLAY DEVICE, METHOD OF MANUFACTURING DISPLAY DEVICE, AND GUIDE STRUCTURE USED THEREIN

CROSS-REFERENCE TO RELATED APPLICATION

This application claims priority from and the benefit of Korean Patent Application No. 10-2019-0063023, filed on May 29, 2019, which is hereby incorporated by reference for all purposes as if fully set forth herein.

BACKGROUND

Field

Exemplary embodiments of the invention relate generally to a method of manufacturing a display device and, more specifically, to a guide structure used in the method of manufacturing the same.

Discussion of the Background

A display device may include a display panel that displays an image, and a window that protects an upper portion of the display panel and provides a display surface to the display device. The display panel and the window may be combined with lamination or the like.

Recently, a window having a curved shape has been developed, and the display panel may be combined to the window having the curved shape. The display panel may be formed to be flexible so as to be combined to the window having the curved shape.

When a lower portion of the display panel is exposed during a process of combining the display panel and the window, the display panel may be damaged by an impact from outside. Accordingly, a protective member for protecting the lower portion of the display panel may be used.

The above information disclosed in this Background section is only for understanding of the background of the inventive concepts, and, therefore, it may contain information that does not constitute prior art.

SUMMARY

Methods according to exemplary embodiments of the invention are capable of preventing a display panel from being damaged, and a guide structure used in the same.

Additional features of the inventive concepts will be set forth in the description which follows, and in part will be apparent from the description, or may be learned by practice of the inventive concepts.

A display device according to an exemplary embodiment includes a display panel having a first surface and a second surface opposite to the first surface, a guide structure disposed on the first surface of the display panel, and a window disposed on the second surface of the display panel, in which the guide structure includes a guide film configured to apply a preliminary pressure to the display panel, and a cover panel disposed between the guide film and the display panel, the cover panel including a cushion layer.

A width of the guide film may be greater than a width of the display panel.

The guide film may include a polymer resin.

The guide structure may further include an adhesive layer disposed between the guide film and the cover panel, the adhesive layer including a UV light curing adhesive.

The cover panel may further include a heat dissipation layer disposed between the guide film and the cushion layer.

The heat dissipation layer may include at least one of graphite and copper (Cu).

The cover panel may further include an embossing layer disposed between the cushion layer and the display panel.

The embossing layer may include a black material.

The window may include a plane area and at least one bending area extending from the plane area.

The display panel may be bent along the at least one bending area of the window.

The display device may further include a polarizing layer disposed between the display panel and the window, and an adhesive layer disposed between the polarizing layer and the window, the adhesive layer including an optically transparent adhesive.

At least a portion of the display panel may be bent by the preliminary pressure applied from the guide film.

A method of manufacturing a display device according to another exemplary embodiment includes attaching a guide structure to a first surface of a display panel, the guide structure including a guide film and a cover panel stacked one over another, applying a preliminary pressure to the display panel by the guide film, such that the display panel has a predetermined curvature, arranging a window on a second surface of the display panel opposite to the first surface, and detaching the guide film from the cover panel.

The window may include a plane area and at least one bending area extending from the plane area.

Arranging the window may include bending the display panel along the at least one bending area of the window.

The method may further include irradiating the guide film with a UV light before detaching the guide film.

The method may further include irradiating the window with a UV light to attach the window to the display panel after detaching the guide film.

The method may further include removing air bubbles between the display panel and the window before attaching the window.

A guide structure according to yet another exemplary embodiment includes a guide film configured to apply a preliminary pressure to a display panel, and a cover panel disposed on the guide film, the cover panel including a cushion layer, in which a width of the guide film is greater than a width of the cover panel.

The cover panel may further include a heat dissipation layer disposed between the guide film and the cushion layer, and an embossing layer disposed on the cushion layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
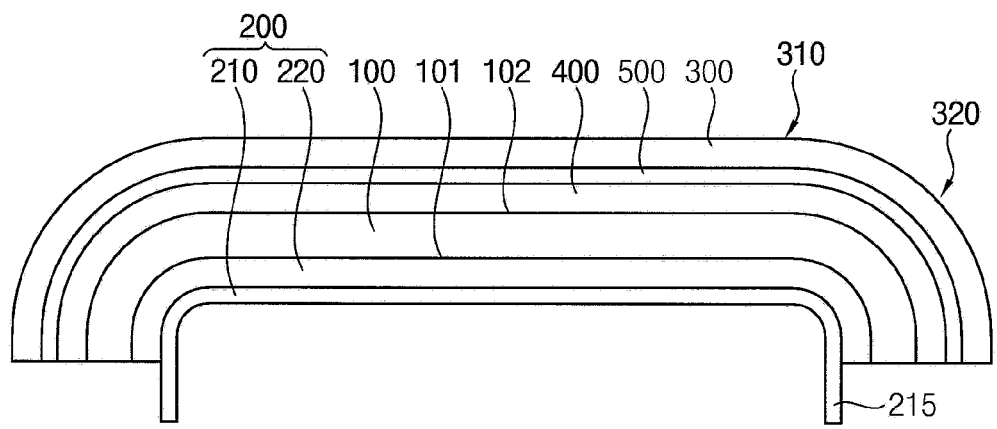
FIG. 1 is a cross-sectional view illustrating a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display device according to an exemplary embodiment will be described with reference to FIGS. 1 to 4.

FIG. 1 is a cross-sectional view illustrating a display device according to an exemplary embodiment.

Referring to FIG. 1, a display device may include a display panel 100, a guide structure 200, a window 300, a polarizing layer 400, and an adhesive layer 500. The display device may be a bendable display device, in which at least a portion of a display surface is bent.

The display panel 100 may include a plurality of pixels, and may generate an image by light emitted from each of the pixels. The display panel 100 may include a first surface 101 and a second surface 102 opposite to the first surface 101. For example, the first surface 101 and the second surface 102 may be a lower surface and an upper surface of the display panel 100, respectively. In an exemplary embodiment, the display panel 100 may display an image through the second surface 102.

In an exemplary embodiment, the display panel 100 may be an organic light emitting display panel including an organic light emitting diode. However, the inventive concepts are not limited thereto, and in another exemplary embodiment, the display panel 100 may be a liquid crystal display panel including a liquid crystal element, a quantum dot display panel including a quantum dot, or the like.

The guide structure 200 may be disposed on the first surface 101 of the display panel 100. The guide structure 200 may protect the first surface 101 of the display panel 100. The guide structure 200 may include a guide film 210 and a cover panel 220.

The cover panel 220 may be disposed on the first surface 101 of the display panel 100. The cover panel 220 may include at least one function layer for absorbing impact applied to the display panel 100, for blocking light incident onto the display panel 100, or for absorbing heat dissipated from the display panel 100.

In an exemplary embodiment, an area of the cover panel 220 may be less than or substantially equal to an area of the display panel 100. For example, a width of the cover panel 220 may be less than or substantially equal to a width of the display panel 100.

The guide film 210 may be disposed on the first surface 101 of the display panel 100 with the cover panel 220 disposed therebetween. In particular, the cover panel 220 may be disposed between the display panel 100 and the guide film 210. The guide film 210 may provide a preliminary pressure to the display panel 100, such that the display panel 100 may have a predetermined curvature. Further, the guide film 210 may absorb impact that may otherwise be applied to the display panel 100. In an exemplary embodiment, the guide film 210 may include polymer resin, such as polyethylene terephthalate (PET), etc.

In an exemplary embodiment, an area of the guide film 210 may be greater than an area of the display panel 100. For example, a width of the guide film 210 may be greater than a width of the display panel 100. Accordingly, the guide film 210 may include a protruding portion 215 protruding further than an edge of the display panel 100. Since the preliminary pressure is provided to the display panel 100 using the protruding portion 215 of the guide film 210, the display panel 100 may have the predetermined curvature.

The polarizing layer 400 may be disposed on the second surface 102 of the display panel 100. The polarizing layer 400 may reduce reflection of external light in the display device. For example, when the external light having passed through the polarizing layer 400 is reflected from an upper portion of the display panel 100 to passes through the polarizing layer 400 again, a phase of the reflected external light may be changed as the incoming external light passes through the polarizing layer 400 twice. As such, a phase of reflected external light may be different from the phase of the incoming external light entering the polarizing layer 400, to cause a destructive interference therebetween. In this manner, the reflection of external light may be reduced to increase visibility of the display device.

The window 300 may be disposed on the second surface 102 of the display panel 100 with the polarizing layer 400 disposed therebetween. In particular, the polarizing layer 400 may be disposed between the display panel 100 and the window 300. The window 300 may protect the display panel 100 from external impact, and may provide a display surface of the display device. In an exemplary embodiment, the window 300 may include glass, polymer resin, such as polycarbonate (PC), polymethyl methacrylate (PMMA), polyarylate (PAR), polyethersulfone (PES), polyethylene terephthalate (PET), polyethylene naphthalate (PEN), etc., or the like.

The window 300 may include a plane area 310 and at least one bending area 320. The bending area 320 may extend from the plane area 310. The plane area 310 may be substantially flat, and the bending area 320 may be bent with a predetermined curvature. In an exemplary embodiment, the window 300 may include two bending areas 320 opposite to each other with the plane area 310 disposed therebetween. However, the inventive concepts are not limited thereto, and in another exemplary embodiment, the window 300 may include four bending areas 320 opposite to each other with the plane area 310 disposed therebetween.

Each of the display panel 100, the guide structure 200, and the polarizing layer 400, which are disposed under the window 300, may have a bending portion bent along the bending area 320 of the window 300. Each of the display panel 100, the guide structure 200, and the polarizing layer 400 may be formed of flexible material, as thus, may be bent along the bending area 320 of the window 300 while receiving a preliminary pressure from the guide film 210.

An adhesive layer 500 may be disposed between the window 300 and the polarizing layer 400. The adhesive layer 500 may include an optically clear adhesive (OCA). The adhesive layer 500 may combine the window 300 and the polarizing layer 400 by ultraviolet (UV) light.

Figure 2:
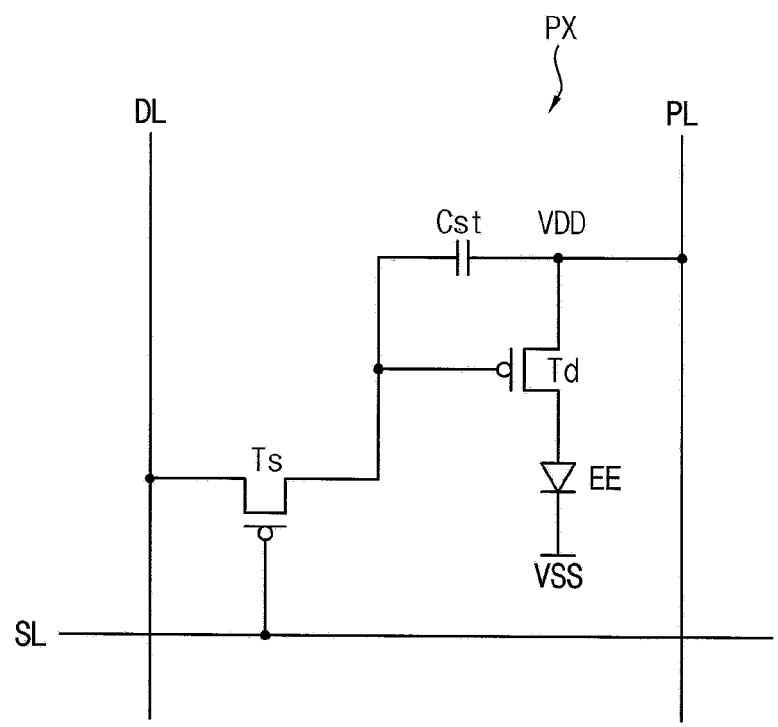
FIG. 2 is an exemplary circuit diagram of a pixel included in the display device of FIG. 1.

FIG. 2 is an exemplary circuit diagram of a pixel included in the display device of FIG. 1.

Referring to FIG. 2, the display device may include signal lines, and a plurality of pixels PX connected to the signal lines and arranged in a substantially matrix form.

The signal lines may include a scan line SL for transmitting a scan signal (or a gate signal), a data line DL for transmitting a data signal, and a driving voltage line PL for transmitting a driving voltage VDD. The scan line SL may substantially extend along a row direction. The data line DL and the driving voltage line PL may substantially extend along a column direction, and may be in parallel to each other.

Each pixel PX may include a switching thin film transistor Ts, a driving thin film transistor Td, a storage capacitor Cst, and a light emitting element EE.

The switching thin film transistor Ts may have a control terminal, an input terminal, and an output terminal. The control terminal of the switching thin film transistor Ts may be connected to the scan line SL, the input terminal of the switching thin film transistor Ts may be connected to the data line DL, and the output terminal of the switching thin film transistor Ts may be connected to the driving thin film transistor Td. The switching thin film transistor Ts may transmit the data signal applied to the data line DL to the driving thin film transistor Td in response to the scan signal applied to the scan line SL.

The driving thin film transistor Td may have a control terminal, an input terminal, and an output terminal. The control terminal of the driving thin film transistor Td may be connected to the switching thin film transistor Ts, the input terminal of the driving thin film transistor Td may be connected to the driving voltage line PL, and the output terminal of the driving thin film transistor Td may be connected to the light emitting element EE. The driving thin film transistor Td may transmit an output current, of which the magnitude thereof varies depending on a voltage between the control terminal and the output terminal of the driving thin film transistor Td, to the light emitting element EE.

The storage capacitor Cst may connect the control terminal and the input terminal of the driving thin film transistor Td. The storage capacitor Cst may store the data signal applied to the control terminal of the driving thin film transistor Td, and may maintain the data signal after the switching thin film transistor Ts is turned off.

The light emitting element EE may have an anode connected to the output terminal of the driving thin film transistor Td, and a cathode receiving a common voltage VSS. The light emitting element EE may emit light having different luminance depending on the output current of the driving thin film transistor Td.

Figure 3:
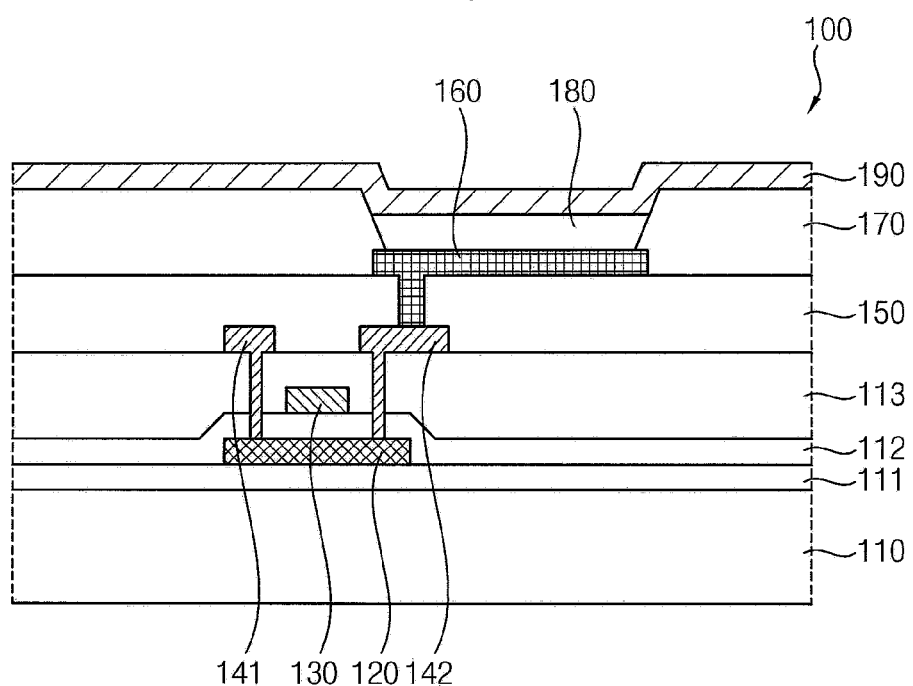
FIG. 3 is a cross-sectional view illustrating a portion of a display panel included in the display device of FIG. 1.

FIG. 3 is a cross-sectional view illustrating a portion of the display panel 100 included in the display device of FIG. 1. More particularly, FIG. 3 shows a cross-sectional view of the structure of the pixel PX shown in FIG. 2 according to an exemplary embodiment. The driving thin film transistor Td and the switching thin film transistor Ts may have substantially the same cross-sectional structure, and thus, FIG. 3 exemplarily illustrates only the structures of the driving thin film transistor Td and the light emitting element EE.

Referring to FIG. 3, the display panel 100 may include a substrate 110, a buffer layer 111, a semiconductor layer 120, a gate insulation layer 112, a gate electrode 130, an insulation interlayer 113, a source electrode 141, a drain electrode 142, a planarization layer 150, a first electrode 160, a pixel defining layer 170, an intermediate layer 180, and a second electrode 190.

The substrate 110 may be a transparent insulating substrate including glass, quartz, ceramic, polymer resin, or the like. The polymer resin may be an organic material, and may include polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), cellulose triacetate (TAC), and cellulose acetate propionate (CAP), without being limited thereto.

The buffer layer 111 may be disposed on the substrate 110. The buffer layer 111 may include silicon nitride, silicon oxide, silicon oxynitride, etc. The buffer layer 111 may have a single-layer structure or a multilayer structure. The buffer layer 111 may prevent impurities from permeating through the substrate 110, and may planarize an upper portion of the substrate 110.

The semiconductor layer 120 may be disposed on the buffer layer 111. The semiconductor layer 120 may include polycrystalline silicon, amorphous silicon, an oxide semiconductor, etc. The semiconductor layer 120 may include a channel region, a source region, and a drain region respectively formed at opposite sides of the channel region. Each of the source region and the drain region may be doped with p-type impurities or n-type impurities.

The gate insulation layer 112 may be disposed on the semiconductor layer 120. The gate insulation layer 112 may insulate the gate electrode 130 from the semiconductor layer 120. The gate insulation layer 112 may include silicon nitride, silicon oxide, silicon oxynitride, etc. The gate insulation layer 112 may have a single-layer structure or a multilayer structure.

The gate electrode 130 may be disposed on the gate insulation layer 112. The gate electrode 130 may overlap the channel region of the semiconductor layer 120. The gate electrode 130 may include metal, such as aluminum (Al), titanium (Ti), molybdenum (Mo), copper (Cu), nickel (Ni), etc., or an alloy thereof. The gate electrode 130 may have a single-layer structure or a multilayer structure.

The insulation interlayer 113 may be formed on the gate electrode 130. The insulation interlayer 113 may insulate the source electrode 141 and the drain electrode 142 from the gate electrode 130. The insulation interlayer 113 may include silicon nitride, silicon oxide, silicon oxynitride, etc. The insulation interlayer 113 may have a single-layer structure or a multilayer structure.

A source contact hole and a drain contact hole respectively exposing the source region and the drain region of the semiconductor layer 120 may be formed in the insulation interlayer 113 and the gate insulation layer 112.

The source electrode 141 and the drain electrode 142 respectively connected to the source region and the drain region of the semiconductor layer 120 through the contact holes may be disposed on the insulation interlayer 113. Each of the source electrode 141 and the drain electrode 142 may include metal, such as aluminum (Al), titanium (Ti), molybdenum (Mo), copper (Cu), nickel (Ni), etc., or an alloy thereof. Each of the source electrode 141 and the drain electrode 142 may have a single-layer structure or a multilayer structure. For example, each of the source electrode 141 and the drain electrode 142 may have a triple-layer structure of Ti—Cu—Ti, Ti—Ag—Ti, or Mo—Al—Mo.

The semiconductor layer 120, the gate electrode 130, the source electrode 141, and the drain electrode 142 may form the driving thin film transistor Td shown in FIG. 2.

The planarization layer 150 may be disposed on the source electrode 141 and the drain electrode 142. The planarization layer 150 may protect thin film transistors (e.g., the driving thin film transistor Td and the switching thin film transistor Ts), and may planarize upper portions of the thin film transistors. The planarization layer 150 may include an inorganic insulation material or an organic insulation material. The planarization layer 150 may have a single-layer structure or a multilayer structure. A contact hole exposing the drain electrode 142 may be formed in the planarization layer 150.

The first electrode 160 connected to the drain electrode 142 through the contact hole may be disposed on the planarization layer 150. The first electrode 160 may be the anode of the light emitting element EE.

The pixel defining layer 170 may be disposed on the first electrode 160. The pixel defining layer 170 may have an opening exposing the first electrode 160. The pixel defining layer 170 may include polymer resin, such as polyacrylates or polyimides, silica based inorganic material, or the like.

The intermediate layer 180 may be disposed in the opening of the pixel defining layer 170. The intermediate layer 180 may include an emission layer and a function layer, and the function layer may include at least one of a hole injection layer (HIL), a hole transport layer (HTL), an electron transport layer (ETL), and an electron injection layer (EIL).

When the intermediate layer 180 includes all of the aforementioned layers, the hole injection layer may be disposed on the first electrode 160, and the hole transport layer, the emission layer, the electron transport layer, and the electron injection layer may be sequentially stacked on the hole injection layer.

The second electrode 190 may be disposed on the pixel defining layer 170 and the intermediate layer 180. The second electrode 190 may be the cathode of the light emitting element EE shown in FIG. 2. The first electrode 160, the intermediate layer 180, and the second electrode 190 may form the light emitting element EE.

Based on a direction to which light is emitted from the light emitting element EE, the display device may be one of a top emission type, a bottom emission type, and a dual emission type.

When the display device is the top emission type, the first electrode 160 may be formed as a reflective layer, and the second electrode 190 may be formed as a semi-transparent layer or a transparent layer. When the display device is the bottom emission type, the first electrode 160 may be formed as the semi-transparent layer or the transparent layer, and the second electrode 190 may be formed as the reflective layer. When the display device is the dual emission type, each of the first electrode 160 and the second electrode 190 may be formed as the semi-transparent layer or the transparent layer.

The reflective layer and the semi-transparent layer may include at least one metal, such as magnesium (Mg), silver (Ag), gold (Au), calcium (Ca), lithium (Li), chromium (Cr), and aluminum (Al), or an alloy thereof. The reflective layer and the semi-transparent layer may be divided according to its thickness, and the semi-transparent layer may have a thickness of about 200 nm or less. The transparent layer may include indium tin oxide (ITO), indium zinc oxide (IZO), zinc oxide (ZnO), indium oxide ($In_2O_3$), etc.

Figure 4:
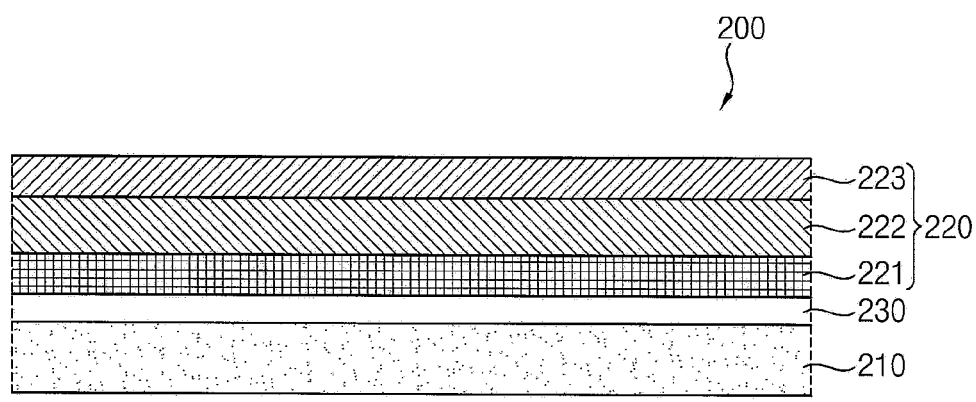
FIG. 4 is a cross-sectional view illustrating a portion of a guide structure included in the display device of FIG. 1.

FIG. 4 is a cross-sectional view illustrating a portion of the guide structure 200 included in the display device of FIG. 1.

Referring to FIGS. 1 and 4, the guide structure 200 may include the guide film 210, the cover panel 220, and an adhesive layer 230. The cover panel 220 may include a heat dissipation layer 221, a cushion layer 222, and an embossing layer 223.

The cushion layer 222 may be disposed on the first surface 101 of the display panel 100, and may reduce impact that may otherwise be applied to the display panel 100. The cushion layer 222 may include polymer resin, such as polypropylene (PP) or polyethylene (PE). In an exemplary embodiment, the cushion layer 222 may include any material that has a density of about 0.5 $g/cm^3$ or more. The cushion layer 222 may be formed as a foam or gel. In an exemplary embodiment, the cushion layer 222 may include a material having high elastic force, for example, rubber.

The embossing layer 223 may be disposed between the cushion layer 222 and the display panel 100. The embossing layer 223 may have an adhesive property. The embossing layer 223 may include, or define, a plurality of air discharge holes on a surface thereof facing the display panel 100 to increase adhesiveness.

In an exemplary embodiment, the embossing layer 223 may include a black material. When the embossing layer 223 includes the black material, the embossing layer 223 may prevent elements disposed under the cover panel 220 from being visible to thereabove, and may block light that may otherwise be incident into the display panel 100 from under the cover panel 220.

The heat dissipation layer 221 may be disposed between the guide film 210 and the cushion layer 222. The heat dissipation layer 221 may include graphite and/or copper (Cu). In an exemplary embodiment, the heat dissipation layer 221 may have a multilayer structure formed of a layer including the graphite and a layer including the copper. The heat dissipation layer 221 may disperse heat, and may emit heat transferred from the display panel 100 to the outside.

The adhesive layer 230 may be disposed between the guide film 210 and the cover panel 220. The adhesive layer 230 may include a UV curing adhesive. Accordingly, an adhesiveness of the adhesive layer 230 may be changed upon irradiation of UV light. For example, an adhesiveness of the adhesive layer 230 may be reduced after being irradiated with UV light.

Hereinafter, a method of manufacturing a display device according to an exemplary embodiment will be described with reference to FIGS. 5 to 12.

Figure 5:
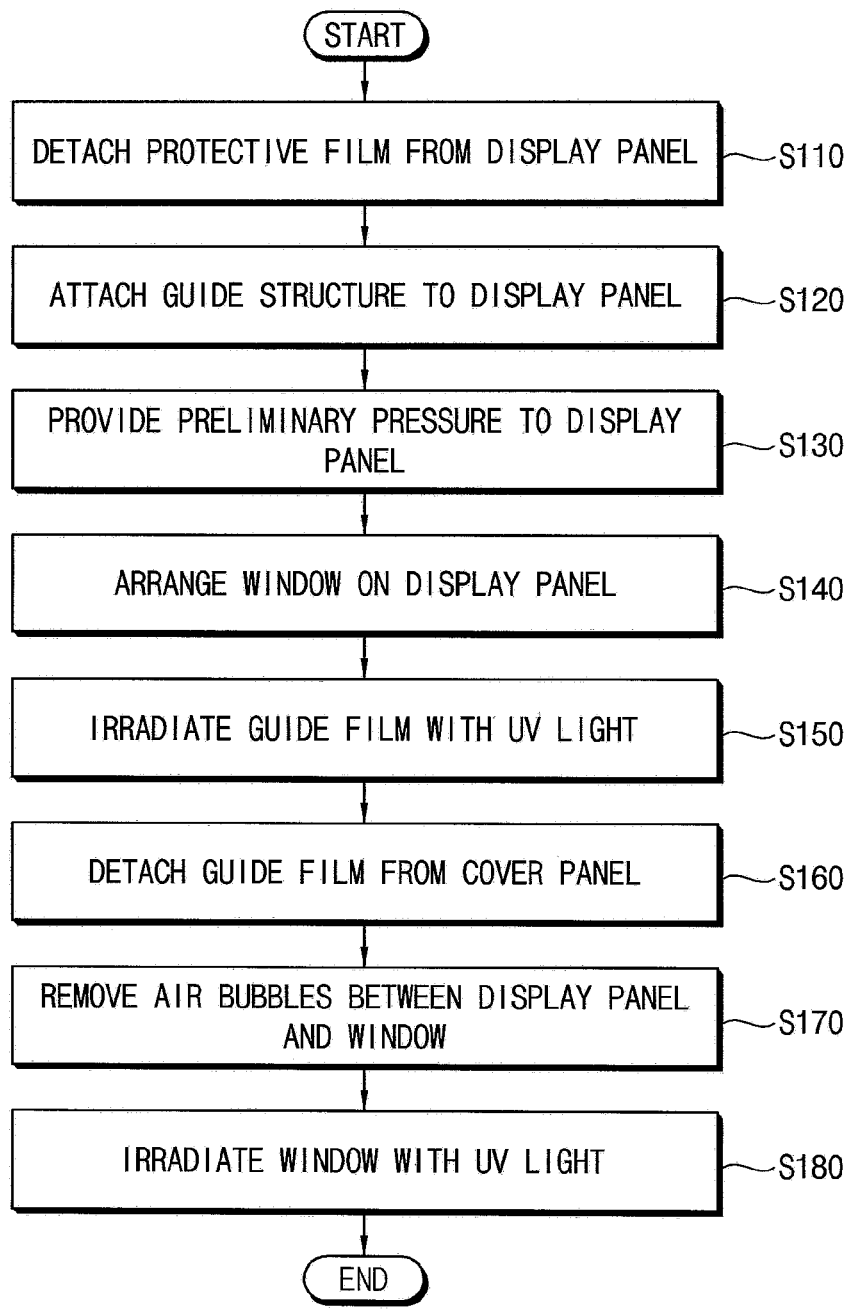
FIG. 5 is a flowchart illustrating a method of manufacturing a display device according to an exemplary embodiment.

FIG. 5 is a flowchart illustrating a method of manufacturing a display device according to an exemplary embodiment.

Referring to FIG. 5, a method of manufacturing a display device according to an exemplary embodiment may include detaching a protective film from a display panel (S110), attaching a guide structure to the display panel (S120), providing a preliminary pressure to the display panel (S130), arranging a window on the display panel (S140), irradiating a guide film with UV light (S150), detaching the guide film from a cover panel (S160), removing air bubbles between the display panel and the window (S170), and irradiating the window with UV light (S180).

FIGS. 6, 7, 8, 9, 10, 11, and 12 are cross-sectional views illustrating a method of manufacturing a display device according to an exemplary embodiment.

Figure 6:
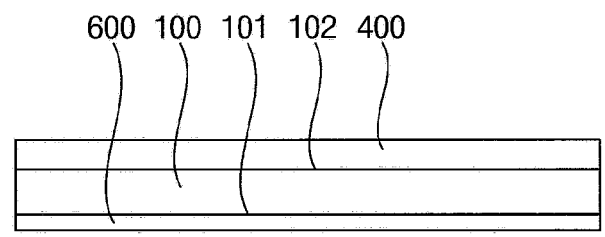
FIGS. 6, 7, 8, 9, 10, 11, and 12 are cross-sectional views illustrating a method of manufacturing a display device according to an exemplary embodiment.

Referring to FIG. 6, the display panel 100 may be prepared. A protective film 600 may be attached to the first surface 101 of the display panel 100. The protective film 600 may prevent the first surface 101 of the display panel 100 from being damaged by external impact, etc. The protective film 600 may include polymer resin having flexibility. The polarizing layer 400 may be formed on the second surface 102 of the display panel 100.

Figure 7:
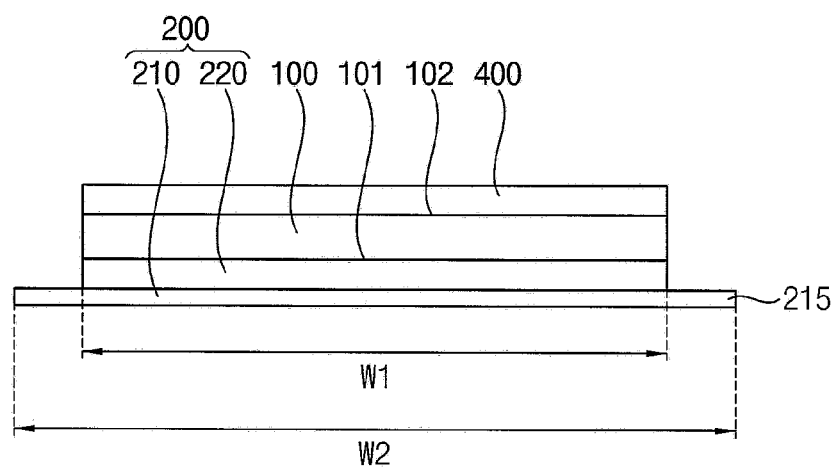

Referring to FIGS. 5 and 7, the protective film 600 may be detached from the display panel 100 (S110), and the guide structure 200 may be attached to the display panel 100 (S120). The protective film 600 may be detached from the first surface 101 of the display panel 100 using a peeling member, such as a tape, a needle, etc.

Then, the guide structure 200 may be attached to the first surface 101 of the display panel 100. The guide structure 200 may include the guide film 210 and the cover panel 220 combined by the adhesive layer 230 shown in FIG. 4. The guide structure 200 may be attached to the display panel 100, such that the cover panel 220 may be in contact with the first surface 101 of the display panel 100. In this manner, the cover panel 220 may be disposed between the guide film 210 and the display panel 100.

In an exemplary embodiment, an area of the guide film 210 may be greater than an area of the display panel 100. For example, a width W2 of the guide film 210 may be greater than a width W1 of the display panel 100. Accordingly, the guide film 210 may include the protruding portion 215 protruding further than an edge of the display panel 100 to the outside.

Figure 8:
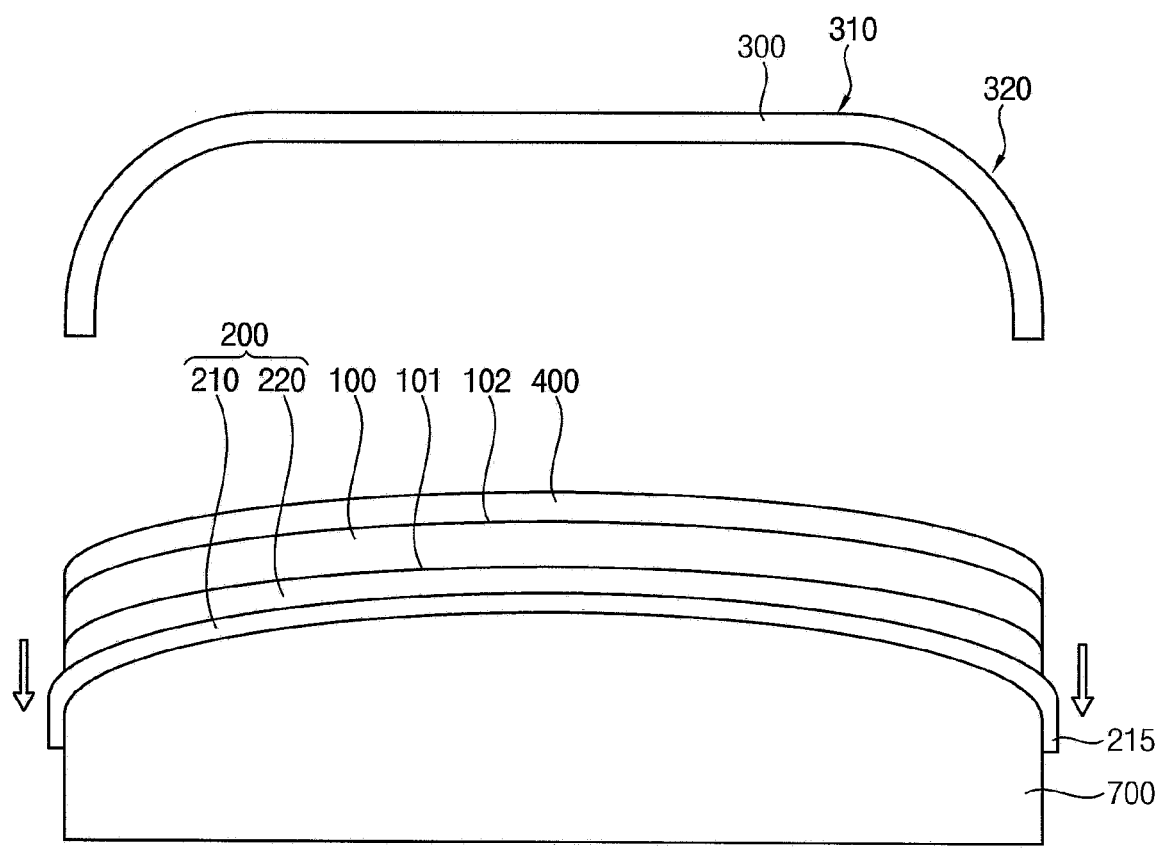

Referring to FIGS. 5 and 8, a preliminary pressure may be provided to the display panel 100, such that the display panel 100 may have a predetermined curvature (S130). More particularly, the display panel 100 having the guide film 210 attached to the first surface 101 may be seated on a pressing pad 700, and may be disposed under the window 300. For example, the display panel 100 may be seated, such that a center portion of the guide film 210 of the guide structure 200 may be in contact with the pressing pad 700. The window 300 may include the plane area 310 and at least one bending area 320 extending from the plane area 310.

Then, the preliminary pressure may be provided to opposite ends of the display panel 100 towards the pressing pad 700. In an exemplary embodiment, the protruding portion 215 of the guide film 210 may be pulled in one direction (e.g., a lower direction) as illustrated in FIG. 8, and the guide film 210 may be substantially adhered to an upper surface and a side surface of the pressing pad 700. In this manner, the preliminary pressure may be provided to the opposite ends of the display panel 100. Based on the preliminary pressure provided from the guide film 210, the display panel 100 may be deformed from a flat shape to a curved shape. As such, the display panel 100 may have a predetermined curvature. Further, each of the guide structure 200 disposed on the first surface 101 of the display panel 100 and the polarizing layer 400 disposed on the second surface 102 of the display panel 100 may be deformed to have a predetermined curvature.

Figure 9:
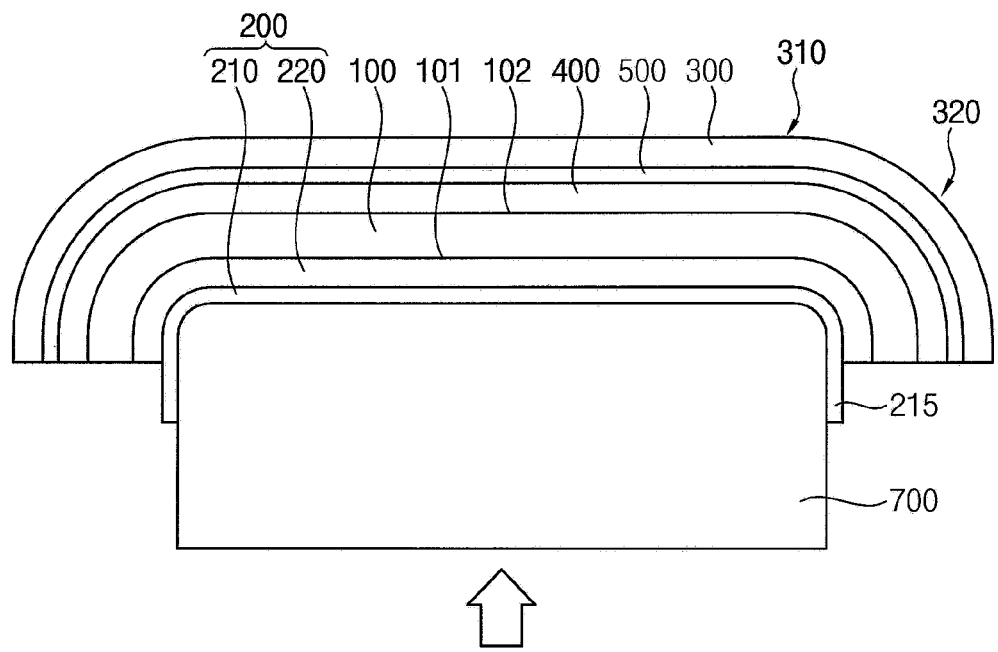

Referring to FIGS. 5 and 9, the window 300 may be arranged on the display panel 100, such that the display panel 100 may have a curved portion (S140). In particular, the pressing pad 700 may move along another direction (e.g., an upper direction) as shown in FIG. 9, and the polarizing layer 400 disposed on the second surface 102 of the display panel 100 may be in contact with the window 300. For example, the adhesive layer 500 may be formed between the polarizing layer 400 and the window 300.

Then, the pressing pad 700 may press the display panel 100 in the upward direction, for example, such that the display panel 100 may have a plane area corresponding to the plane area 310 of the window 300 and a bending area corresponding to the bending area 320 of the window 300. Further, each of the guide structure 200 disposed on the first surface 101 of the display panel 100 and the polarizing layer 400 disposed on the second surface 102 of the display panel 100 may have a plane area corresponding to the plane area 310 of the window 300 and a bending area corresponding to the bending area 320 of the window 300. In this manner, the display panel 100, the guide structure 200, and the polarizing layer 400 may be bent along a shape of the window 300 that has the bending area 320.

Figure 10:
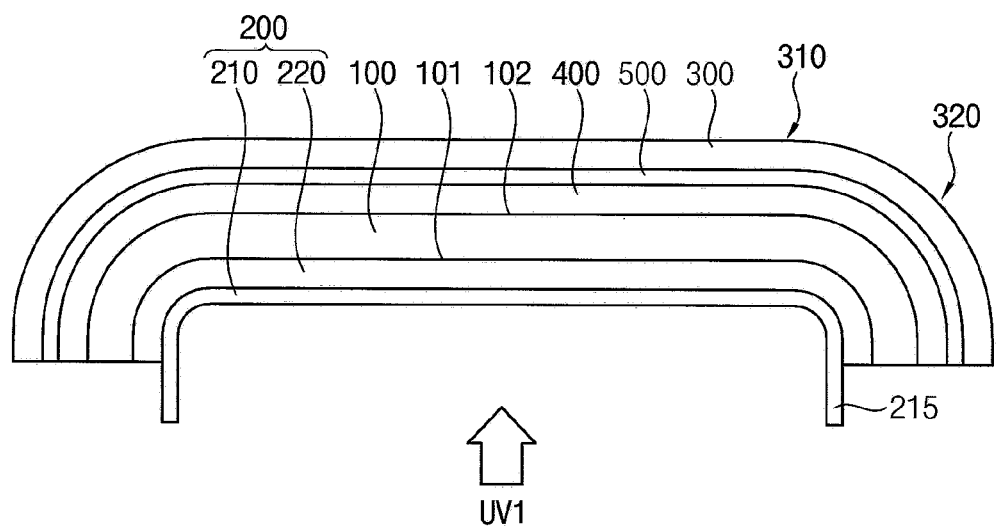

Referring to FIGS. 5 and 10, the guide film 210 may be irradiated with UV light UV1 (S150). As described above, the guide film 210 and the cover panel 220 may be combined by the adhesive layer 230 shown in FIG. 4, and the adhesive layer 230 may include the UV curing adhesive. The adhesive layer 230 may be cured by irradiating the guide film 210 with the UV light UV1, which may reduce the adhesiveness of the adhesive layer 230. For example, the adhesiveness of the adhesive layer 230 before irradiation of the UV light UV1 may be greater than about 2000 gf/in, and the adhesiveness of the adhesive layer 230 after irradiation of the UV light UV1 may be less than about 20 gf/in.

Figure 11:
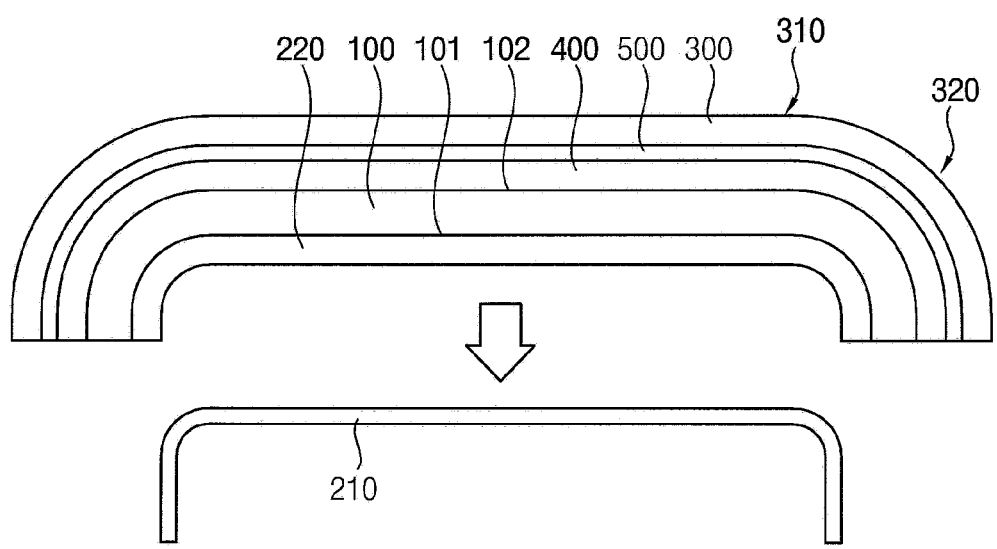

Referring to FIGS. 5 and 11, the guide film 210 may be detached from the cover panel 220 (S160). When the adhesiveness of the adhesive layer 230 decreases by irradiation of the UV light UV1, the guide film 210 may be easily separated from the cover panel 220. Since the guide film 210 that has an area or a width greater than that of the display panel 100 is detached from the cover panel 220, the display panel 100 may be easily transferred in a subsequent process.

Figure 12:
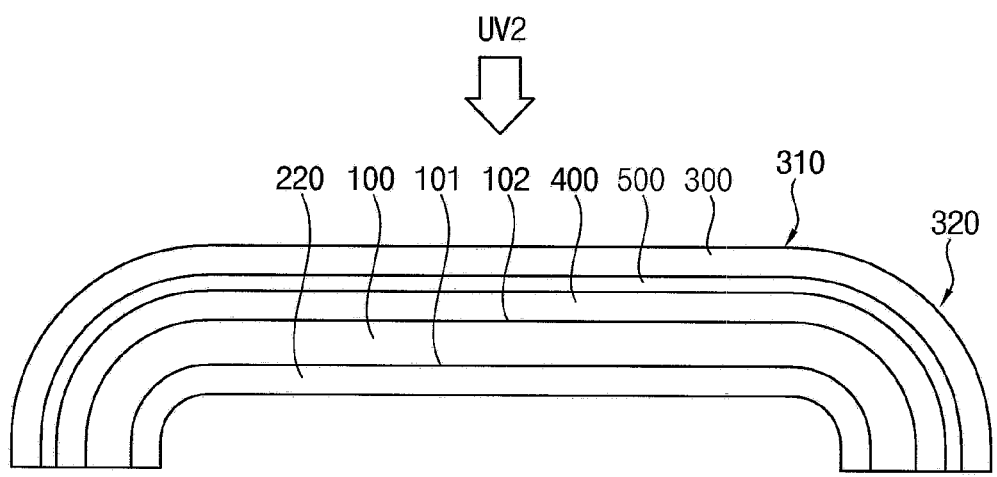

Referring to FIGS. 5 and 12, air bubbles between the display panel 100 and the window 300 may be removed (S170), and the window 300 may be irradiated with UV light UV2. More particularly, air bubbles between the polarizing layer 400 and the window 300 may be removed. In the process of adjoining the polarizing layer 400 to the window 300 through the adhesive layer 500, air bubbles may be generated between the polarizing layer 400 and the window 300. When the air bubbles exist in a display area of the display device from which an image is displayed, the air bubbles may be recognized by a user, which may degrade the quality of the image. Accordingly, the air bubbles between the polarizing layer 400 and the window 300 may be removed by an autoclave process, for example. According to an exemplary embodiment, the autoclave process may be performed at about 60° C. for about 30 minutes.

Then, the window 300 may be irradiated with the UV light UV2 to combine the window 300 and the polarizing layer 400. The adhesive layer 500 may be disposed between the polarizing layer 400 and the window 300, and the adhesive layer 500 may include an optically clear adhesive (OCA). The window 300 may be irradiated with the UV light UV2, so that the window 300 may be attached to the polarizing layer 400.

According to a comparative embodiment, the window 300 may be arranged on the display panel 100 while the guide film 210 is attached to the first surface 101 of the display panel 100, and an autoclave process and a process of irradiating the window 300 with UV light may be performed while the guide film 210 is detached from the display panel 100. In this case, during the autoclave process and the process of irradiating the window 300 with the UV light, the display panel 100 may be damaged by external impact as the first surface 101 of the display panel 100 is exposed, and an additional process of attaching the cover panel 220 to the first surface 101 of the display panel 100 may be required after the autoclave process and the process of irradiating the window 300 with the UV light.

According to an exemplary embodiment, however, the window 300 may be arranged on the display panel 100 while the guide structure 200 including the guide film 210 and the cover panel 220 is attached to the first surface 101 of the display panel 100, and an autoclave process and a process of irradiating the window 300 with the UV light UV2 may be performed while the guide film 210 is detached from the cover panel 220. In this manner, during the autoclave process and the process of irradiating the window 300 with the UV light UV2, the display panel 100 may not be damaged by external impact as the cover panel 220 is disposed on the first surface 101 of the display panel 100. Further, a process of attaching the cover panel 220 to the first surface 101 of the display panel 100 after the autoclave process and the process of irradiating the window 300 with the UV light UV2 may be obviated.

Figure 13:
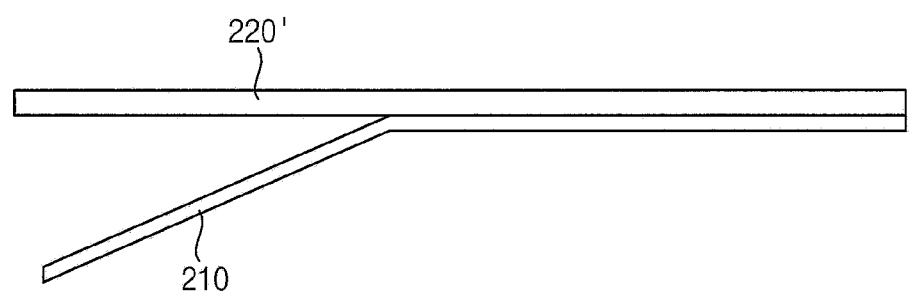
FIGS. 13, 14, and 15 are cross-sectional views illustrating a method of manufacturing a guide structure according to an exemplary embodiment.
Figure 14:
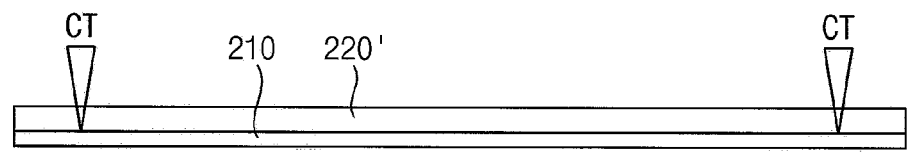
Figure 15:
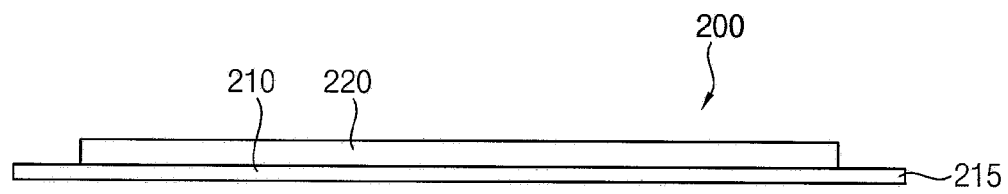

FIGS. 13, 14, and 15 are cross-sectional views illustrating a method of manufacturing the guide structure 200 according to an exemplary embodiment.

Referring to FIG. 13, first, the guide film 210 and a preliminary cover panel 220' may be independently formed. The preliminary cover panel 220' may be formed by stacking the heat dissipation layer 221, the cushion layer 222, and the embossing layer 223 shown in in FIG. 4.

Then, the guide film 210 and the preliminary cover panel 220', which are independently formed, may be attached. A UV curing adhesive may be coated between the guide film 210 and the preliminary cover panel 220' to attach the guide film 210 and the preliminary cover panel 220'. Accordingly, the adhesive layer 230 shown in FIG. 4 may be formed between the guide film 210 and the preliminary cover panel 220'.

Referring to FIG. 14, the preliminary cover panel 220' may be cut. The preliminary cover panel 220' may be cut in a thickness direction using a cutting member CT. As shown in FIG. 7, the preliminary cover panel 220' may be cut to correspond to the display panel 100. The preliminary cover panel 220' may be defined into a center portion and an end portion by cutting the preliminary cover panel 220'.

Referring to FIG. 15, the end portion of the preliminary cover panel 220' may be removed so that the guide structure 200 including the guide film 210 and the cover panel 220 may be formed. An area or a width of the guide film 210 may be greater than an area or a width of the cover panel 220. In this manner, the protruding portion 215 of the guide film 210 may protrude further to the outside than an edge of the cover panel 220.

In a comparative embodiment, the guide film 210 and the cover panel 220 may be independently manufactured and handled, which may decrease the efficiency of manufacturing management and quality management. However, according to an exemplary embodiment, the guide structure may include the combined guide film 210 and cover panel 220, which may increase the efficiency of manufacturing management and quality management.

The display device according to the exemplary embodiments may be applied to a display device included in a computer, a notebook, a mobile phone, a smartphone, a smart pad, a PMP, a PDA, an MP3 player, or the like.

According to the exemplary embodiments, the window may be arranged on the display panel while the guide structure including the guide film and the cover panel is attached to the first surface of the display panel, and a process of combining the display panel and the window may be performed while the guide film is detached from the cover panel. In this manner, during the process of combining the display panel and the window, the display panel may not be damaged by external impact as the cover panel is disposed on the first surface of the display panel. Further, a process of attaching the cover panel to the first surface of the display panel after the process of combining the display panel and the window may be obviated.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
a display panel having a first surface and a second surface opposite to the first surface;
a guide structure disposed on the first surface of the display panel; and
a window disposed on the second surface of the display panel,
wherein the guide structure includes:
a guide film configured to apply a preliminary pressure to the display panel; and
a cover panel disposed between the guide film and the display panel, the cover panel including a cushion layer, and
wherein the window includes a plane area and at least one bending area having a predetermined curvature and extending from the plane area, and the display panel includes a plane area and at least one bending area corresponding to the at least one bending area of the window.

2. The display device of claim 1, wherein a width of the guide film is greater than a width of the display panel.

3. The display device of claim 1, wherein the guide film includes a polymer resin.

4. The display device of claim 1, wherein the guide structure further includes an adhesive layer disposed between the guide film and the cover panel, the adhesive layer including a UV light curing adhesive.

5. The display device of claim 1, wherein the cover panel further includes a heat dissipation layer disposed between the guide film and the cushion layer.

6. The display device of claim 5, wherein the heat dissipation layer includes at least one of graphite and copper (Cu).

7. The display device of claim 1, wherein the cover panel further includes an embossing layer disposed between the cushion layer and the display panel.

8. The display device of claim 7, wherein the embossing layer includes a black material.

9. The display device of claim 1, wherein the display panel is bent along the at least one bending area of the window.

10. The display device of claim 1, further comprising:
a polarizing layer disposed between the display panel and the window; and
an adhesive layer disposed between the polarizing layer and the window, the adhesive layer including an optically transparent adhesive.

11. The display device of claim 1, wherein at least a portion of the display panel is bent by the preliminary pressure applied from the guide film.

12. A guide structure, comprising:
a guide film configured to apply a preliminary pressure to a display panel; and
a cover panel disposed on the guide film along a first direction, the cover panel including a cushion layer, a heat dissipation layer disposed between the guide film and the cushion layer, and an embossing layer disposed on the cushion layer,
wherein a width of the guide film is greater than a width of the cover panel, and wherein a distal end of the guide film is disposed further away from the display panel than a middle portion of the guide film along the first direction.

* * * * *